US011723227B1

(12) United States Patent
Lee et al.

(10) Patent No.: US 11,723,227 B1
(45) Date of Patent: Aug. 8, 2023

(54) DISPLAY DEVICE

(71) Applicant: SAMSUNG DISPLAY CO., LTD., Yongin-si (KR)

(72) Inventors: Seung Jae Lee, Seoul (KR); Do-Hoon Kim, Asan-si (KR); Han Soo Kim, Asan-si (KR); Kyung Min Park, Seongnam-si (KR); Cheon Deok Park, Suwon-si (KR); Dong-Yoon So, Hwaseong-si (KR); Young Dae Yi, Cheonan-si (KR); Myung-Wook Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/975,870

(22) Filed: Oct. 28, 2022

Related U.S. Application Data

(63) Continuation of application No. 17/132,866, filed on Dec. 23, 2020, now Pat. No. 11,489,137.

(30) Foreign Application Priority Data

Feb. 14, 2020 (KR) .................... 10-2020-0018579

(51) Int. Cl.
*H10K 50/84* (2023.01)
*H10K 59/40* (2023.01)

(52) U.S. Cl.
CPC ........... *H10K 50/841* (2023.02); *H10K 59/40* (2023.02)

(58) Field of Classification Search
CPC ................ H01L 51/524; H01L 27/323; H01L 27/3272; H01L 51/5246; H01L 51/5253
See application file for complete search history.

(56) References Cited

U.S. PATENT DOCUMENTS

| 2015/0255740 A1* | 9/2015 | Nakada .............. H10K 50/8423 257/40 |
|---|---|---|
| 2019/0036073 A1 | 1/2019 | Yu et al. |
| 2021/0257578 A1 | 8/2021 | Lee et al. |

FOREIGN PATENT DOCUMENTS

| KR | 10-1135538 | 4/2012 |
| KR | 10-2015-0099641 | 9/2015 |
| KR | 10-2020-0094244 | 8/2020 |

* cited by examiner

*Primary Examiner* — Kyoung Lee
(74) *Attorney, Agent, or Firm* — F. Chau & Associates, LLC

(57) ABSTRACT

A display device includes: a first substrate overlapping a second substrate and including a display area and a non-display area; a display element disposed in the display area and between the first substrate and the second substrate; a sealing member disposed in the non-display area and between the first substrate and the second substrate; a touch unit; and a blocking member disposed in the non-display area and on the second substrate, wherein the blocking member includes blocking patterns, each of which has a first edge and a second edge, wherein the first edge extends in a first direction, and the second edge extends in a second direction different from the first direction, wherein a length of the first edge is longer than a length of the second edge, and the second edge of one blocking pattern does not overlap the second edge of another blocking pattern along the second direction.

20 Claims, 11 Drawing Sheets

DISPLAY DEVICE

CROSS-REFERENCE TO RELATED APPLICATIONS

This application is a continuation of U.S. patent application Ser. No. 17/132,866 filed on Dec. 23, 2022, which claims priority under 35 U.S.C. § 119 to Korean Patent Application No. 10-2020-0018579, filed in the Korean intellectual Property Office on Feb. 14, 2020, the disclosures of which are incorporated by reference herein in their entireties.

TECHNICAL FIELD

The present disclosure relates to a display device, and more particularly, to a display device including a blocking pattern.

DISCUSSION OF THE RELATED ART

Generally, a display device may be divided into a display area for displaying an image and a peripheral area around the display area. Further, the display device may include a circuit unit and a sealing member. The circuit unit may transfer a signal to a plurality of pixels in the display area, and the sealing member may seal the display area and may be disposed in the peripheral area.

The sealing member may bond a lower substrate of the display device and an upper substrate of the display device, and may seal a plurality of pixel areas. Typically, in a sealing process for bonding the lower substrate and the upper substrate, the sealing member may be cured after being heated by a laser beam. In addition, the laser beam may be irradiated around a region where the sealing member will be disposed, thereby making the sealing member wider.

In addition, when there is a dummy structure in the non-display area of the display device, static electricity may be introduced into the display device from the outside, and a display panel or a touch panel disposed in the display area of the display device may be damaged by the static electricity.

SUMMARY

According to an exemplary embodiment of the present invention, a display device includes: a first substrate overlapping a second substrate of the display device and including a display area and a non-display area adjacent to the display area; a display element disposed in the display area and between the first substrate and the second substrate; a sealing member disposed in the non-display area and between the first substrate and the second substrate; a touch unit disposed in the display area and on the second substrate; and at least one blocking member disposed in the non-display area and on the second substrate, wherein the at least one blocking member includes a plurality of blocking patterns, each of the blocking patterns has a first edge and a second edge, wherein the first edge extends in a first direction parallel to an edge of the first substrate, and the second edge extends in a second direction different from the first direction, wherein a length of the first edge is longer than a length of the second edge, and the second edge of one blocking pattern of the plurality of blocking patterns does not overlap the second edge of another blocking pattern of the plurality of blocking patterns along the second direction.

In an exemplary embodiment of the present invention, the at least one blocking member includes: a first blocking member disposed between a first portion of the edge of the first substrate and a first portion of the sealing member; and a second blocking member disposed between the first portion of the sealing member and the touch unit.

In an exemplary embodiment of the present invention, the first and second blocking members do not overlap the sealing member.

In an exemplary embodiment of the present invention, the first blocking member includes a plurality of first blocking patterns, a plurality of second blocking patterns, and a plurality of third blocking patterns sequentially disposed from the sealing member toward the edge of the first substrate, wherein the plurality of first blocking patterns, the plurality of second blocking patterns, and the plurality of third blocking patterns are of the plurality of blocking patterns, wherein the first blocking patterns are disposed side by side along the first direction, wherein the second blocking patterns are disposed side by side along the first direction, and wherein the third blocking patterns are disposed side by side along the first direction.

In an exemplary embodiment of the present invention, the second blocking member includes a plurality of fourth blocking patterns, a plurality of fifth blocking patterns, and a plurality of sixth blocking patterns sequentially disposed from the sealing member toward the touch unit, wherein the plurality of fourth blocking patterns, the plurality of fifth blocking patterns, and the plurality of sixth blocking patterns are of the plurality of blocking patterns, wherein the fourth blocking patterns are disposed side by side along the first direction, wherein the fifth blocking patterns are disposed side by side along the first direction, and wherein the sixth blocking patterns are disposed side by side along the first direction.

In an exemplary embodiment of the present invention, a first line extending through a central portion of one of the first blocking patterns along the second direction is disposed between the second edges of two adjacent second blocking patterns.

In an exemplary embodiment of the present invention, a second line extending through a central portion of one of the fourth blocking patterns along the second direction is disposed between the second edges of two adjacent fifth blocking patterns, In an exemplary embodiment of the present invention, the at least one blocking member is disposed on a same layer as the touch unit.

In an exemplary embodiment of the present invention, the display element disposed between the first substrate and the second substrate is sealed by the sealing member.

In an exemplary embodiment of the present invention, the at least one blocking member is disposed on a same layer as the touch unit.

In an exemplary embodiment of the present invention, the display element disposed between the first substrate and the second substrate is at least partially surrounded by the sealing member.

According to an exemplary embodiment of the present invention, a display device includes: a first substrate overlapping a second substrate of the display device and including a display area and a non-display area around the display area; a sealing member disposed in the non-display area and between the first substrate and the second substrate; and a blocking member disposed in the non-display area and on the second substrate to not overlap the sealing member, wherein the blocking member includes a plurality of first blocking patterns and a plurality of second blocking patterns, wherein the plurality of first blocking patterns are disposed side by side along a first direction parallel to an edge of the first substrate, and the plurality of second blocking patterns are disposed side by side along the first direction, and wherein a first line extends through a central portion of one of the first blocking patterns along a second direction that is substantially perpendicular to the first direction and is positioned between the second edges of two adjacent second blocking patterns.

In an exemplary embodiment of the present invention, the display device further includes a touch unit disposed in the display area and on the second substrate, wherein the blocking member is disposed on a same layer as the touch unit.

In an exemplary embodiment of the present invention, each of the first blocking patterns and the second blocking patterns have a first edge and a second edge, wherein the first edge extends parallel with the first direction, and the second edge extends parallel with the second direction, and a length of the first edge is longer than that of the second edge.

In an exemplary embodiment of the present invention, the blocking member is disposed on a same layer as the touch unit.

In an exemplary embodiment of the present invention, the display device further includes a display element disposed between the first substrate and the second substrate and sealed by the sealing member.

In an exemplary embodiment of the present invention, the blocking member is disposed on a same layer as a touch unit of the display device.

In an exemplary embodiment of the present invention, the display device further includes a display element disposed between the first substrate and the second substrate and sealed by the sealing member.

According to an exemplary embodiment of the present invention, a display device includes: a first substrate including a first area and a second area at least partially surrounding the first area; a second substrate overlapping the first substrate; a display element disposed in the first area; a sealing member disposed in the second area and between the first substrate and the second substrate; a touch unit overlapping the display element; and a first blocking member disposed in the second area and on the second substrate, herein the first blocking member includes a plurality of first blocking patterns and a plurality of second blocking patterns, wherein the plurality of first blocking patterns are disposed along a first direction parallel to an edge of the first substrate, and the plurality of second blocking patterns are disposed along the first direction, wherein the plurality of first blocking patterns are misaligned with the plurality of second blocking patterns in a second direction crossing the first direction.

In an exemplary embodiment of the present invention, the first blocking member further includes a plurality of third blocking patterns disposed along the first direction, wherein the plurality of second blocking patterns are disposed between the plurality of first blocking patterns and the plurality of third blocking patterns, and wherein the plurality of third blocking patterns are misaligned with the plurality of second blocking patterns in the second direction.

DETAILED DESCRIPTION OF THE EMBODIMENTS

Figure 1:
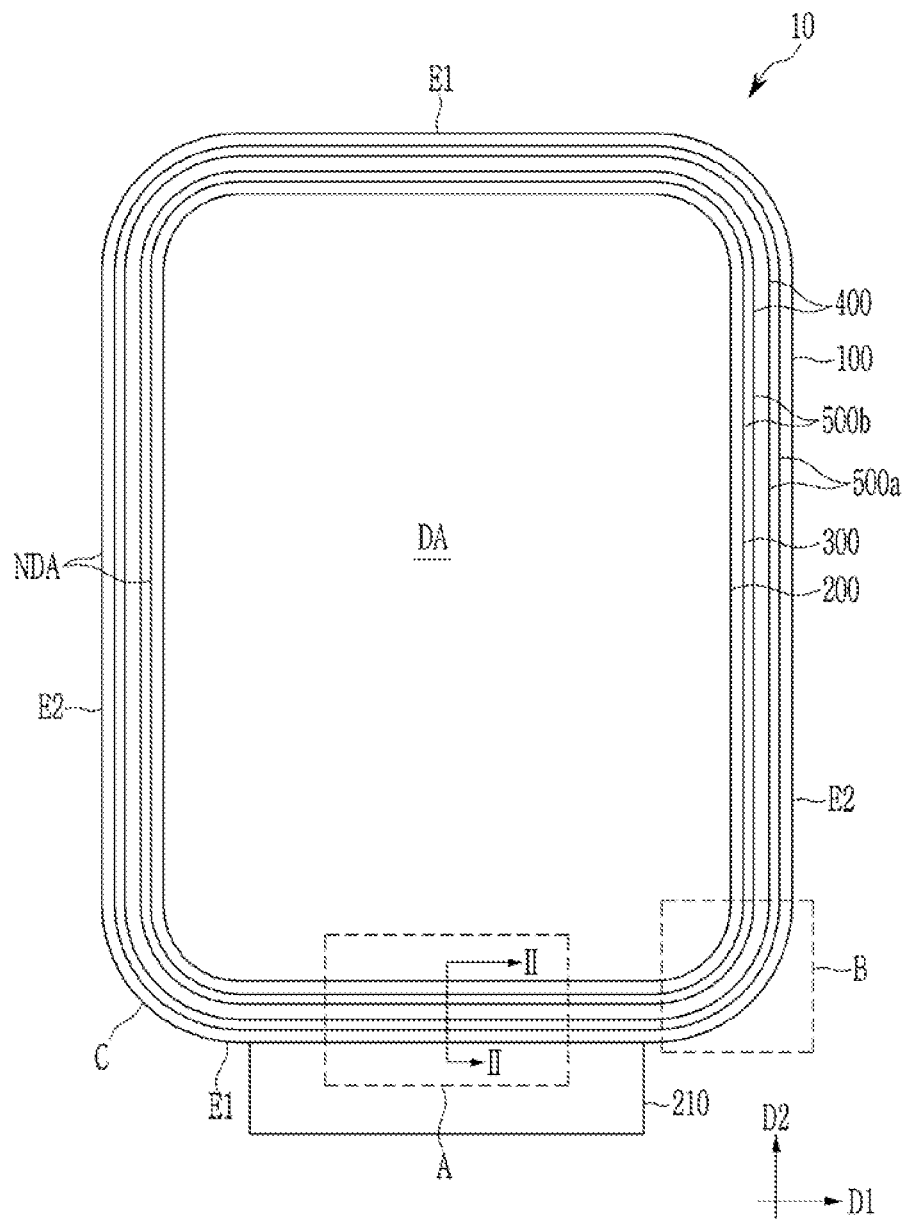
FIG. 1 illustrates a plan view of a display device according to an exemplary embodiment of the present invention.

Hereinafter, exemplary embodiments of the present invention will be described in detail with reference to the accompanying drawings. The present invention may be embodied in many different forms, and should not be construed as limited to the exemplary embodiments set forth herein.

It is to be understood that like reference numerals may refer to like or similar constituent elements throughout the specification, and thus, repetitive descriptions may be omitted.

Further, since sizes and thicknesses of constituent members shown in the accompanying drawings may be exaggerated for clarity, the present invention is not limited to the illustrated sizes and thicknesses.

It will be understood that when an element such as a layer, film, region, or substrate is referred to as being "on" another element, it can be directly on the other element or intervening elements may also be present. In addition, when an element is referred to as being "directly on" another element, there are no intervening elements present.

Further, in the specification, the phrase "in a plan view" refers to when an object portion is viewed from above, and the phrase "in a cross-section" refers to a view from a side of a cross-section of a target part, taken by vertically cutting an object portion.

Hereinafter, exemplary embodiments of the present invention will be described in more detail with reference to accompanying drawings.

Figure 2:
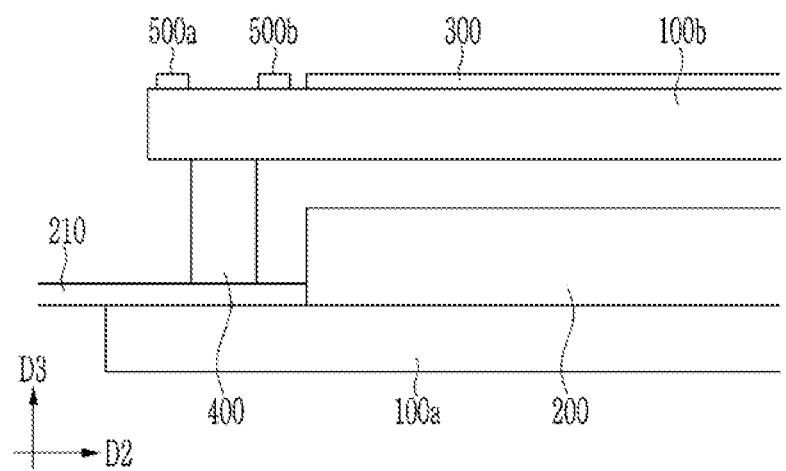
FIG. 2 illustrates a cross-sectional taken along a line II-II of FIG. 1.

Referring to FIG. 1 and FIG. 2, a display device according to an exemplary embodiment of the present invention will be described. FIG. 1 illustrates a plan view of a display device according to an exemplary embodiment of the present invention, and FIG, 2 illustrates a cross-sectional view taken along a line II-II of FIG. 1.

Referring to FIG. 1, the display device 10 includes a display area DA and a non-display area NDA. The display area DA displays an image, and the non-display area NDA is positioned around the display area DA. For example, the display device 10 includes a substrate 100, and the substrate 100 may include the display area DA and the non-display area NDA.

The display area DA may include a plurality of pixels. For example, each of the pixels may include an organic light emitting element or a liquid crystal layer. For example, each pixel includes a first electrode, a second electrode, an organic light emitting element, and thin film transistors and signal lines electrically connected to the organic light emitting element. Further, the organic light emitting element may include an organic emission layer positioned between the first electrode and the second electrode. However, the present invention is not limited thereto. For example, each pixel may include the first electrode, the second electrode, a liquid crystal layer, and thin film transistors and signal lines connected to the first electrode or the second electrode.

The non-display area NDA may be positioned to at least partially surround the display area DA. The non-display area NDA may include a sealing member 400 for sealing the display area DA, and a first blocking member 500a and a second blocking member 500b is disposed at opposite sides of the sealing member 400.

The display device 10 may include two first edges E1, two second edges E2, and four corner portions C. The two first edges E1 extend in a direction parallel to a first direction D1 and face each other with the display area DA therebetween, and the two second edges E2 extend in a direction parallel to a second direction D2 different from the first direction D1 and face each other with the display area DA therebetween. Further, the four corner portions C are positioned between the first edges E1 and the second edges E2. Each of the corner portions C may be formed to have a curvature, but a shape of each corner portion C is not limited thereto. For example, the corner portions C may form right angles. A driving circuit 210 may be disposed adjacent to one of the two first edges E1, and a length of first edges E1 and a length of the second edges E2 may be different.

Referring to FIG. 2 together with FIG. 1, the display device 10 includes a first substrate 100a, a second substrate 100b, a display element 200, and the sealing member 400 disposed between the first substrate 100a and the second substrate 100b. The first substrate 100a may face the second substrate 100b. In addition, the display device 10 may include a touch unit 300, the first blocking member 500a, and the second blocking member 500b.

The second substrate 100b is disposed to be spaced apart from the first substrate 100a along a third direction D3 that is substantially perpendicular to the first direction D1 and the second direction D2 and that is substantially perpendicular to surfaces of the first substrate 100a and the second substrate 100b. For example, the second substrate 100b may be an encapsulation substrate for encapsulating the display element 200.

The display element 200 may include a plurality of pixels.

The touch unit 300 is disposed at a position overlapping the display element 200 along the third direction D3, and may sense a touch input from the outside. Herein, the touch input includes when an external object such as a user's hand directly touches a touch surface of the display device 10 and when the external object approaches the touch surface of the display device 10 or hovers in a state in which the external object approaches the touch surface of the display device 10.

The touch unit 300 may be disposed in the display area DA, but the present invention is not limited thereto. For example, a portion of the touch unit 300 may be disposed in the non-display area NDA.

The sealing member 400 may be cured after being heated through light energy such as a laser beam, and the display element 200 disposed in the display area DA may be sealed by bonding the first substrate 100a and the second substrate 100b to each other.

The first blocking member 500a and the second blocking member 500b may be spaced apart from each other, and may be disposed at opposite sides of the sealing member 400, from a plan view, to not overlap the sealing member 400 along the third direction D3. However, the present invention is not limited thereto. For example, some edges of the first blocking member 500a and the second blocking member 500b may overlap the sealing member 400 along the third direction D3, and in this case, most of the first blocking member 500a and the second blocking member 500b may not overlap the sealing member 400 along the third direction D3.

The first blocking member 500a and the second blocking member 500b may be disposed on a same layer as the touch unit 300, and may be formed at a same layer as a signal line included in the touch unit 300. The first blocking member 500a and the second blocking member 500b may block light such as a laser beam.

When light such as a laser beam is irradiated to the sealing member 400, the first blocking member 500a and the second blocking member 500b may prevent light from being irradiated to sides of a position where the sealing member 400 is to be formed, thereby preventing the sealing member 400 from being widened. When the first blocking member 500a and the second blocking member 500b are not disposed around a region where the sealing member 400 is to be formed, light such as a laser beam may be irradiated to a peripheral region around a region where the sealing member 400 is to be formed so that the sealing member 400 is disposed not only in the region where the sealing member 400 is to be formed, but also in the peripheral region of the region where the sealing member 400 is to be formed, thereby increasing a width of the sealing member 400. The first blocking member 500a and the second blocking member 500b may not allow light to pass through the peripheral region of the region where the sealing member 400 is to be formed, thereby preventing the width of the sealing member 400 from being widened beyond a predetermined point.

Figure 3:
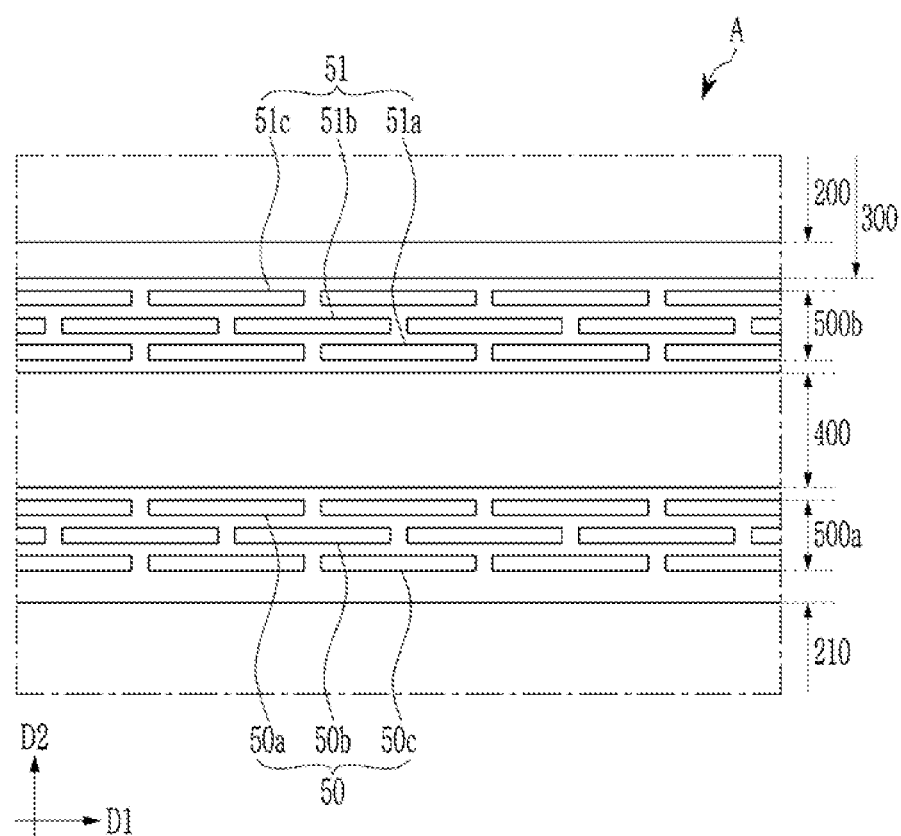
FIG. 3 illustrates an enlarged view showing a portion A of FIG. 1.

The non-display area NDA positioned at a first edge E1 of the display device 10 will be described in more detail with reference to FIG. 3 together with FIG. 1 and FIG. 2. FIG. 3 illustrates an enlarged view showing an enlarged portion A of FIG. 1.

Referring to FIG. 3, the non-display area NDA includes the first blocking member 500a and the second block member 500b. The first blocking member 500a may be disposed between the first edge E1 and the sealing member 400, and the second blocking member 500b may he disposed between the sealing member 400 and the touch unit 300, on a plane formed by intersection of the first direction D1 and the second direction D2.

The first blocking member 500a includes a first group blocking patterns 50 including a plurality of first blocking patterns 50a, a plurality of second blocking patterns 50b, and a plurality of third blocking patterns 50c positioned sequentially from the sealing member 400 toward the first edge E1. The first blocking patterns 50a are arranged in the first direction D1 parallel to the first edge E1, and the second blocking patterns 50b are arranged along the first direction D1. The third blocking patterns 50c are arranged along the first direction D1. For example, the first blocking patterns 50a, the second blocking patterns 50b, and the third blocking patterns 50c may be disposed in lines along the first direction D1.

In each of the first blocking patterns 50a, the second blocking patterns 50b, and the third blocking patterns 50c, a length of an edge thereof parallel to the first direction Di is longer than that of an edge thereof parallel to the second direction D2, For example, each of the first blocking patterns 50a, the second blocking patterns 50b, and the third blocking patterns 50c may have a rectangular shape. However, the present invention is not limited thereto.

Edges parallel to the second direction D2 among edges of the first blocking patterns 50a do not overlap edges parallel to the second direction D2 among edges of the second blocking patterns 50b, along the second direction D2. Similarly, edges parallel to the second direction D2 among edges of the second blocking patterns 50b do not overlap edges parallel to the second direction D2 among edges of the third blocking patterns 50c, along the second direction D2. For example, the first blocking patterns 50a may be misaligned with the second blocking patterns 50b, and the second blocking patterns 50b may be misaligned with the third blocking patterns 50c.

The second blocking member 500b includes a second group of blocking patterns 51 including a plurality of fourth blocking patterns 51a, a plurality of fifth blocking patterns 51b, and a plurality of sixth blocking patterns 51c sequentially positioned from the sealing member 400 toward the touch unit 300. The fourth blocking patterns 51a are arranged along the first direction D1 parallel to the first edge E1, and the fifth blocking patterns 51b are arranged along the first direction D1. The sixth blocking patterns 51c are arranged in the first direction D1. For example, the fourth blocking patterns 51a, the fifth blocking patterns 51b, and the sixth blocking patterns 51c may be disposed in lines along the first direction D1.

In each of the fourth blocking patterns 51a, the fifth blocking patterns 51b, and the sixth blocking patterns 51c, a length of an edge thereof parallel to the first direction D1 is longer than that of an edge thereof parallel to the second direction D2. For example, each of the fourth blocking patterns 51a, the fifth blocking patterns 51b, and the sixth blocking patterns 51c may have a rectangular shape. However, the present invention is not limited thereto.

Edges parallel to the second direction D2 among edges of the fourth blocking patterns 51a do not overlap edges parallel to the second direction D2 among edges of the fifth blocking patterns 51b, along the second direction D2. Similarly, edges parallel to the second direction D2 among edges of the fifth blocking patterns 51b do not overlap edges parallel to the second direction D2 among edges of the sixth blocking patterns 51c along the second direction D2. For example, the fourth blocking patterns 51a may be misaligned with the fifth blocking patterns 51b, and the fifth blocking patterns 51b may be misaligned with the six blocking patterns 51c.

As such, edges of the third blocking patterns 50c, the second blocking patterns 50b, and the first blocking patterns 50a of the first blocking member 500a may be not disposed in a line, but may be disposed in a zigzag form along the second direction D2. In addition, edges of the fourth blocking patterns 51a, the fifth blocking patterns 51b, and the sixth blocking patterns 51c of the second blocking member 500b may be disposed in a zigzag form along the second direction D2 without being disposed in a line.

As described above, static electricity, etc. may be prevented from flowing into the touch unit 300 and the display element 200 along the edges of the blocking patterns 50c, 50b, and 50a because the edges of the blocking patterns 50c, 50b, and 50a may be disposed closer to the first edge E1 of the display device 10 than to the touch unit 300 and the display element 200. In addition, static electricity, etc. may be prevented from flowing into the touch unit 300 and the display element 200 along the edges of the blocking patterns 51a, 51b, and 51c because edges of the blocking patterns 51a, 51b, and 51c may be disposed in a line along a direction between the touch unit 300 and the first blocking member 500a. For example, the blocking patterns 51a, 51b, and 51c may be closer to the first edge of the display device 10 than to the touch unit 300 and the display element 200.

This will be described in more detail later.

Figure 4:
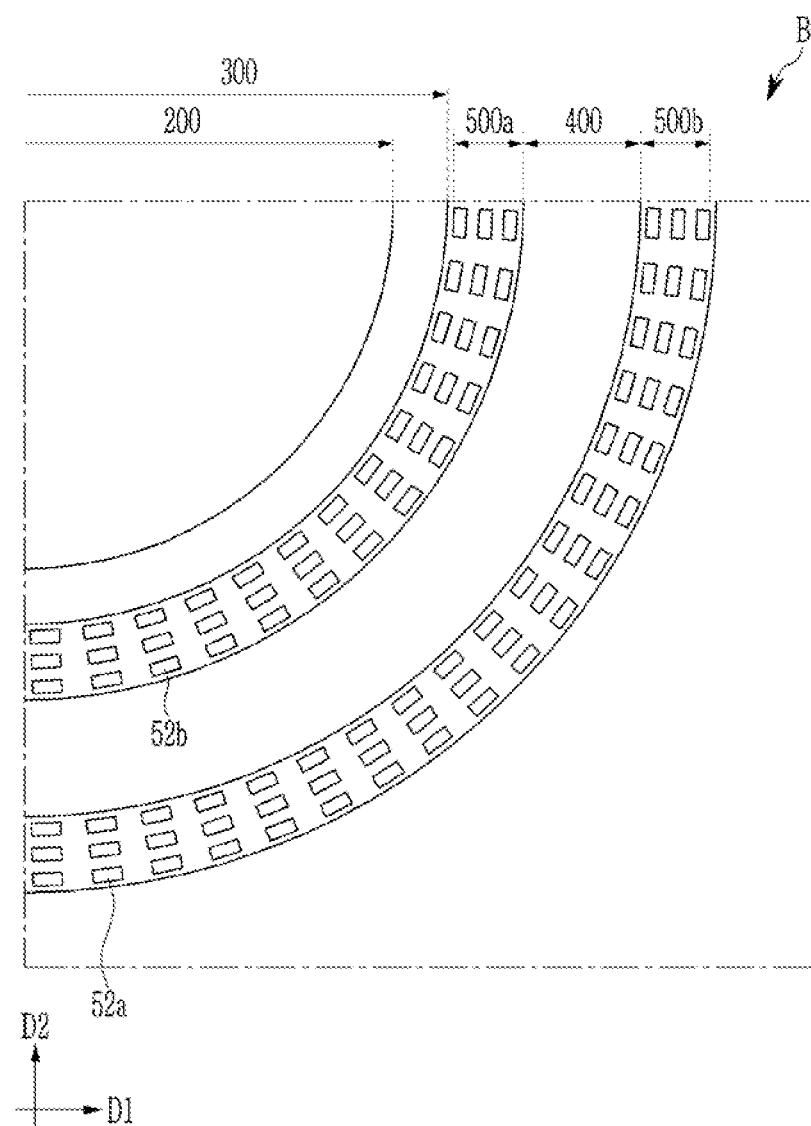
FIG. 4 illustrates an enlarged view showing a portion B of FIG. 1.

The non-display area NDA positioned at a corner portion C of the display device 10 will be described in more detail with reference to FIG. 4 together with FIG. 1 and FIG. 2, FIG. 4 illustrates an enlarged view showing a portion 13 of FIG. 1.

Referring to FIG. 4, the non-display area NDA of the corner portion C includes the first blocking member 500a and a second blocking member 500b. The first blocking member 500a is disposed between an edge of the display device 10 and the sealing member 400, and the second blocking member 500b is disposed between the sealing member 400 and the touch unit 300, on a plane formed by intersection of the first direction D1 and the second direction D2.

The first blocking member 500a includes a plurality of seventh blocking patterns 52a, and the second blocking member 500b includes a plurality of eighth blocking patterns 52b. The seventh blocking patterns 52a and the eighth blocking patterns 52b may be disposed to be spaced apart from each other along the edge of the display device 10 and the edge of the sealing member 400.

Each of the blocking patterns 52a and 52b of the non-display area NDA adjacent to the corner portion C described with reference to FIG. 4 have a polygonal shape such as a rectangular shape, and the blocking patterns 52a and 52b may be arranged alongside the edges of the corner portion C, unlike the non-display area NDA positioned on an edge extending in a direction without forming a curved surface among the edges of the display device 10 illustrated in FIG. 3.

Figure 5:
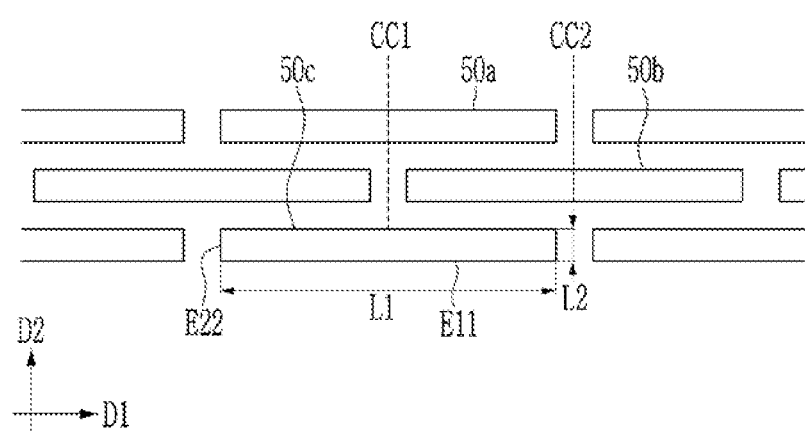
FIG. 5 illustrates an enlarged view showing a blocking pattern of a display device according to an exemplary embodiment of the present invention.

In addition, the blocking patterns of the display device according to an exemplary embodiment of the present invention will be described in more detail with reference to FIG. 5. FIG. 5 illustrates an enlarged view showing a blocking pattern of a display device according to an exemplary embodiment of the present invention.

The first blocking member 500a of the non-display area NDA positioned on an edge extending in a direction without forming a curved surface among the edges of the display device illustrated in FIG. 3 will be described as an example with reference to FIG. 5.

Referring to FIG. 5, a first length L1 of a third edge E11 parallel to the first direction D1 is longer than a second length L2 of a fourth edge E22 parallel to the second direction D2 in each of the first blocking patterns 50a, the second blocking patterns 50b, and the third blocking patterns 50c.

The fourth edge E22 of each of the first blocking patterns 50a does not overlap the fourth edge E22 of each of the second blocking patterns 50b along the second direction D2. Similarly, the fourth edge E22 of each of the second blocking patterns 50b does not overlap the fourth edge E22 of each of the third blocking patterns 50c along the second direction D2.

A virtual first center line CC1 extending through central portions of the first blocking patterns 50a and extending along the second direction D2 may be positioned between the fourth edges E22 of the adjacent two second blocking patterns 50b. A virtual second center line CC2 extending through central portions of the second blocking patterns 50b and extending along the second direction D2 may be positioned between the fourth edges E22 of the two adjacent third blocking patterns 50c.

In addition, a shape or disposal of the blocking patterns 51a, 51b, and 51c of the second blocking member 500b is similar to that of the blocking patterns 50a, 50b, and 50c of the first blocking member 500a illustrated in FIG. 5.

Figure 6:
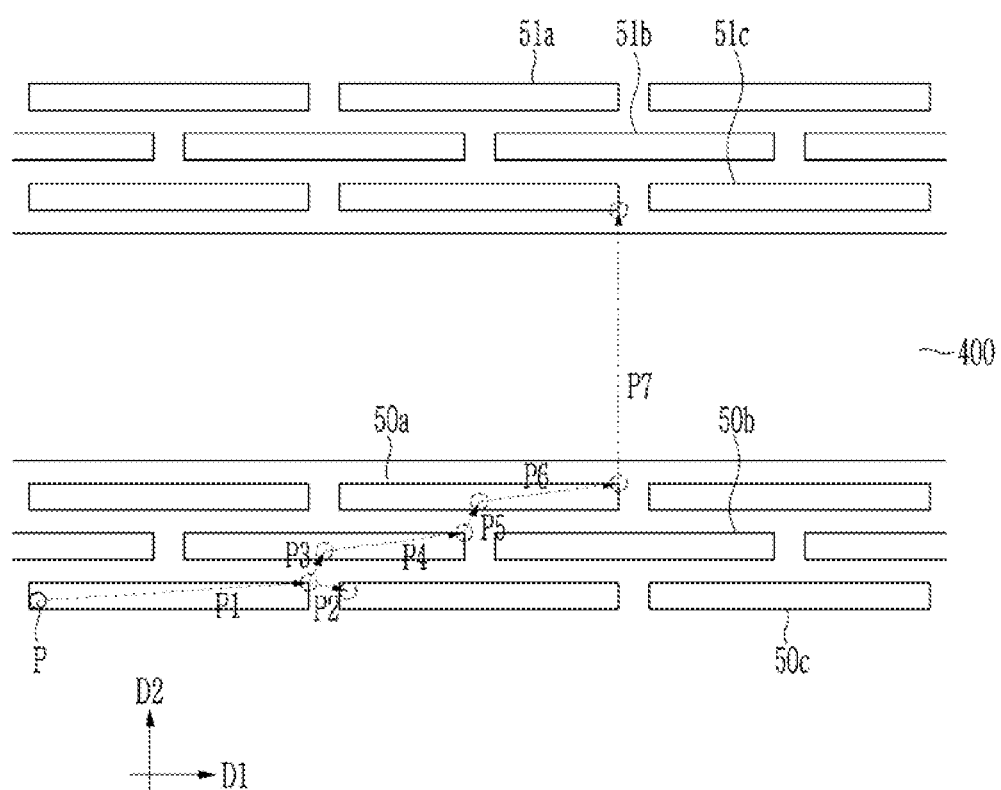
FIG. 6 illustrates a schematic view showing a movement of electrostatic particles in a display device according to an exemplary embodiment of the present invention.
Figure 7:
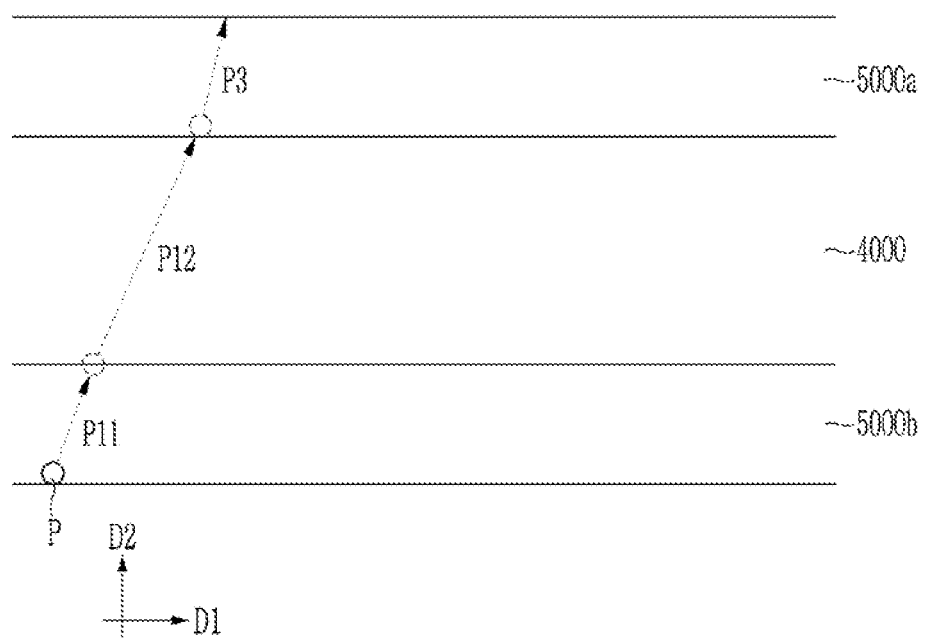
FIG. 7 illustrates a schematic view showing a movement of electrostatic particles in a general display device according to a comparative example.

A movement of electrostatic particles that can be introduced from the outside will be conceptually described with reference to FIG. 6 and FIG. 7. FIG. 6 illustrates a schematic view showing a movement of electrostatic particles (e.g., charged particles) in a display device according to an exemplary embodiment of the present invention, and FIG. 7 illustrates a schematic view showing a movement of electrostatic particles in a general display device according to a comparative example.

Referring to FIG. 6, when electrostatic particles P are introduced into any one of the third blocking patterns 50c from the outside, the introduced electrostatic particles P may move toward an edge of a third blocking patterns 50c, that is adjacent to the electrostatic particles P, along a first path P1, and then may move toward another third blocking pattern 50c along a second path P2 or may move toward an edge of a second blocking pattern 50b, that is adjacent to the electrostatic particles P, along a third path P3.

The electrostatic particles moved along the second path P2 may move toward another third blocking pattern 50c that is adjacent thereto or may move toward another adjacent second blocking pattern 50b that is adjacent thereto.

The electrostatic particles moved along the third path P3 may move again toward the edge of the second blocking pattern 50b along a fourth path P4, and may move again toward an edge of a first blocking pattern 50a that is adjacent thereto along a fifth path P5. The electrostatic particles moved through the fifth path P5 may move toward another edge or corner in the first blocking pattern 50a along a sixth path P6, and then may move toward the blocking patterns 51a, 51b, and 51c of the second blocking member 500b along a seventh path P7. The electrostatic particles P may move in the blocking patterns 51a, 51b, and 51c of the second blocking member 500b similar to the movement in the first blocking member 500a.

As described above, when the electrostatic particles introduced into the first blocking member 500a from the outside move toward the touch unit 300 and the display element 200 from the first edge E1 of the display device, they do not linearly move along the second direction D2, but move in a direction that is a combination of the first direction D1 and the second direction D2 (e.g., a direction that crosses the first direction D1 and the second direction D2). As described above, the length of the third edge E11 parallel to the first direction D1 is relatively longer than the length of the fourth edge E22 parallel to the second direction D2 among the edges of the blocking patterns 50c, 50b, and 50a of the first blocking member 500a, and thus a movement distance of the electrostatic particles becomes longer than when linearly moving toward the second direction D2. In addition, the fourth edge E22 of each of the third blocking patterns 50c do not overlap to the fourth edge E22 of each of the second blocking patterns 50b, and the fourth edge E22 of each of the third blocking patterns 50c overlaps a central portion of an adjacent second blocking pattern 50b along the second direction D2. As such, it may difficult for the electrostatic particles to linearly move toward the second direction D2 by disposing the fourth edges E22 of the blocking patterns 50c, 50b, and 50a to not overlap each other in the second direction D2. For example, the blocking patterns 50c, 50b, and 50a may be adjacent to each other along the second direction D2.

As such, since the movement path of the electrostatic particles that can be introduced from the outside becomes long, it may be difficult for the electrostatic particles to move to the touch unit 300 and the display element 200, and they may decrease in size or disappear before reaching to the touch unit 300 and the display element 200. Accordingly, it is possible to prevent static electricity from flowing into the touch unit 300 and the display element 200 through the first blocking member 500a and the second blocking member 500b while preventing the width of the sealing member 400 from being widened, by forming the first blocking member 500a and the second blocking member 500b.

A comparative example in which two blocking members 5000a and 5000b are formed to have a plate shape at opposite sides of the sealing member 400 will now be described with reference to FIG. 7. Referring to FIG. 7, the electrostatic particles P introduced from the outside may move in a linear direction through the two blocking members 5000a and 5000b to the touch unit 300 along three paths P11, P12, and P13, As such, the electrostatic particles introduced from the outside may move to the touch unit 300 and the display element 200 through a short path as compared with the first blocking member 500a and the second blocking member 500b of the display device according to the exemplary embodiment of the present invention.

Figure 8:
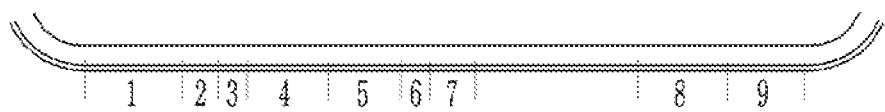
FIG. 8 illustrates a schematic view showing some regions of an edge of a display device according to an experimental example.

Now, one experimental example will be described with reference to FIG. 8. FIG. 8 illustrates a schematic view showing some regions of an edge of a display device according to an experimental example.

In this experimental example, Table 1 shows a comparison of a first width W1 and a second width W2. The first width W1 is of a region of the sealing member 400 where a material layer of the sealing member 400 is stacked, and the second width W2 is of an actually formed sealing member 400 according to each region when the sealing member 400 is formed at a portion of the first edge E1, of the display device 10, connected to a driving circuit unit by irradiating light without forming the blocking members 500a and 500b.

FIG. 8 illustrates regions of the portion of the first edge El of the display device connected to the driving circuit unit. A first region 1 of FIG. 8, which is a region where a driving signal line is positioned, may be, e.g., a region where a second power line ELVSS is positioned, and each of a second region 2 and a third region 3, which are regions where a driving signal line is positioned, may be, e.g., a region where a first power line ELVDD is positioned. Each of a fourth region 4 and a fifth region 5 may be a region where a crack detection line surrounding the non-display area NDA is positioned. Each of the sixth region 6 and a seventh region 7 may be a region where a label for distinguishing cells in a manufacturing process is disposed. An eighth region 8 may be a region in which detection signal lines connected to the touch unit 300 are positioned, and a ninth region 9 may be a region in which the driving signal line, e.g., the second power line ELVSS, is disposed as in the first region 1.

TABLE 1

| Position | 1 | 2 | 3 | 4 | 5 | 6 | 7 | 8 | 9 |
|---|---|---|---|---|---|---|---|---|---|
| W1 (μm) | 374 | 374 | 374 | 374 | 374 | 374 | 374 | 374 | 374 |
| W2 (μm) | 490.73 | 440.15 | 492.04 | 463.51 | 412.91 | 455.73 | 523.16 | 357 | 480.36 |

Referring to Table 1, when a blocking member is not formed around the sealing member 400, it was found that a difference between a first width W1, of a region where a material layer constituting sealing member 400 was actually stacked, and a second width W2, of the sealing member 400 actually formed, was about 100 μm or more. As described above, it has been found that, when a blocking member is not formed around the sealing member 400, a width of the sealing member 400 becomes larger than a desired value, thereby making it difficult to reduce a width of the non-display area NDA.

Figure 9:
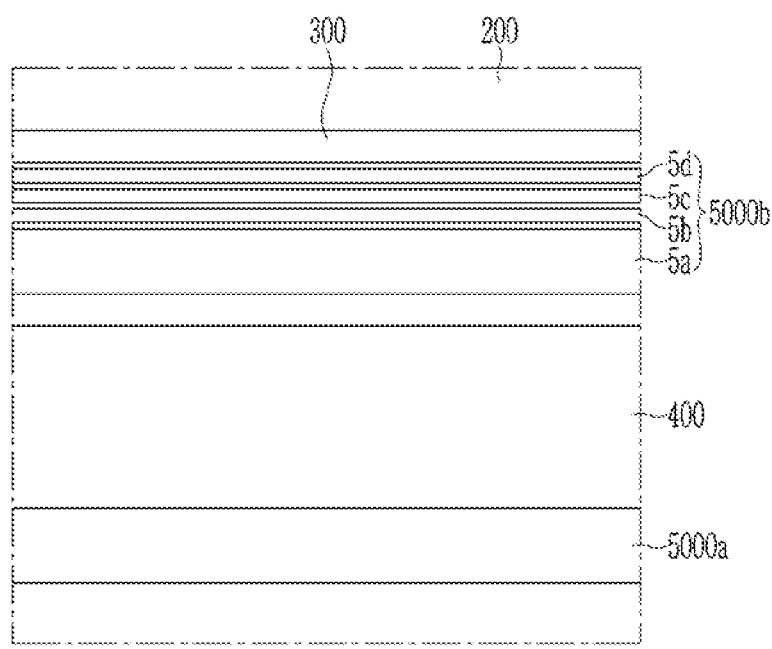
FIG. 9 illustrates a blocking pattern of a display device according to an experimental example.
Figure 10:
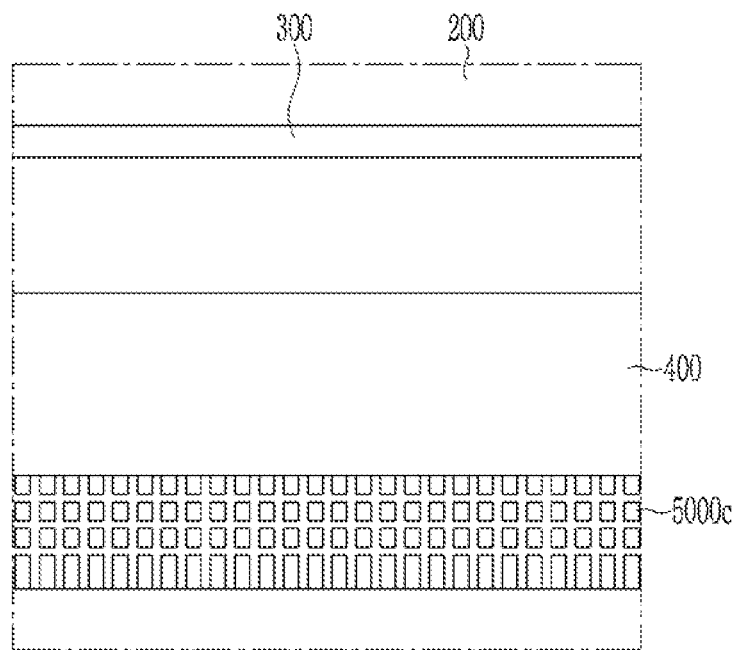
FIG. 10 illustrates a blocking pattern of a display device according to an experimental example.
Figure 11:
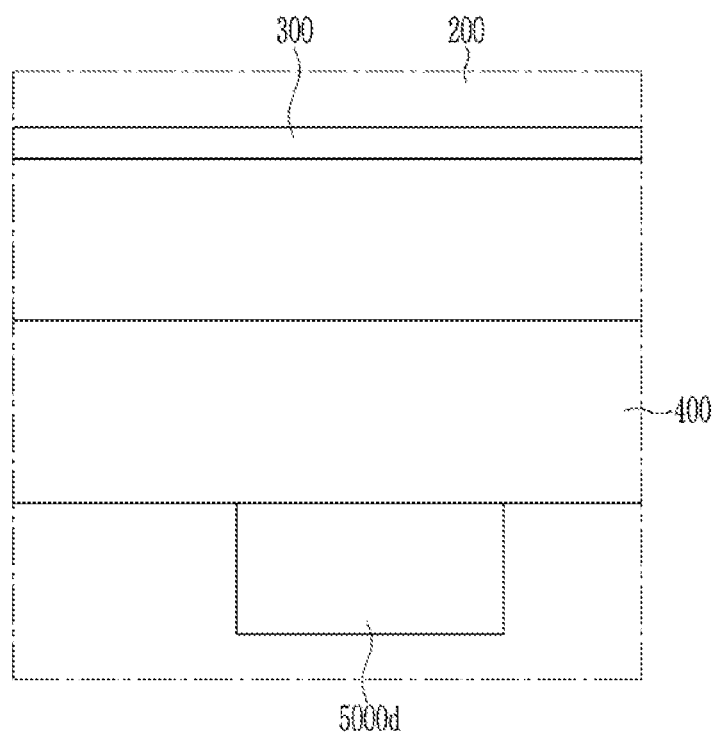
FIG. 11 illustrates a blocking pattern of a display device according to an experimental example.

Now, another experimental example will be described with reference to Tables 2 and 3 together with FIG. 9 to FIG. 11. FIG. 9 to FIG. 11 illustrate examples of a blocking pattern of a display device according to an experimental example.

In this experimental example, a display device was formed five times for a first case (case 1) where the first blocking member 500a and the second blocking member 500b are formed around the sealing member 400 as in the display device according to an exemplary embodiment of the present invention, and for a second case (case 2), a third case (case 3), and a fourth case (case 4) where blocking members are formed as illustrated in FIG. 9 to FIG. 11. For each case, all other conditions were the same, and only the position and shape of the blocking members were different, and then a voltage of a constant magnitude was applied from the outside to measure whether or not a problem occurs in the touch portion (or, e.g., touch unit) of the display device due to static electricity. Table 2 shows a result of applying a voltage of 10 kV from the outside, and Table 3 shows a result of applying a voltage of 8 kV from the outside.

Referring to FIG. 9, in the second case (case 2), a blocking member 5000a having a plate shape was formed between the first edge E1 of the display device and the sealing member 400, and a blocking member 5000b including a plurality of blocking patterns 5a, 5b, 5c, and 5d extending along the first direction D1 was formed between the sealing member 400 and the touch unit 300.

Referring to FIG. 10, in the third case (case 3), a plurality of blocking members 5000c, having edges disposed in a line along the first direction D1 and the second direction D2, were formed between the first edge E1 and the sealing member 400 of the display device, and no blocking member was formed between the sealing member 400 and the touch unit 300.

Referring to FIG. 11, in the fourth case (case 4), a plate-shaped blocking member 5000d was formed in the seventh region 7 of FIG. 8, in which the actual width of the sealing member is the widest, in the result of the previous experimental example, and no blocking member was formed between the sealing member 400 and the touch unit 300.

TABLE 2

| Case | Case 1 | Case 2 | Case 3 | Case 4 |
|---|---|---|---|---|
| 1 | OK | Not OK | OK | OK |
| 2 | OK | Not OK | OK | OK |
| 3 | OK | OK | OK | OK |
| 4 | OK | OK | OK | OK |
| 5 | Not OK | Not OK | Not OK | OK |

TABLE 3

| Case | Case 1 | Case 2 | Case 3 | Case 4 |
|---|---|---|---|---|
| 1 | OK | OK | OK | Not OK |
| 2 | OK | Not OK | OK | Not OK |
| 3 | OK | OK | Not OK | OK |
| 4 | OK | Not OK | OK | OK |
| 5 | OK | OK | OK | Not OK |

Referring to Table 3 and FIG. 4, it was found that one case caused a problem in the touch unit due to static electricity, and the rest did not cause a problem in the touch unit due to static electricity among cases in which a voltage of 10 kV was applied from the outside, in the first case (case 1) where the first blocking member 500a and the second blocking member 500b were formed around the sealing member 400 as in the display device according to an exemplary embodiment of the present invention. It was found that a problem occurred in the touch unit due to static electricity when a voltage of 10 kV was applied from the outside (See Table 2) and a voltage of 8 kV was applied from the outside (See Table 3) in the second case (case 2) where the blocking member was formed as illustrated in FIG. 9.

It was found that a problem occurred one time among 5 times in the touch unit due to static electricity when a voltage of 10 kV was applied and a voltage of 8 kV was applied from the outside in the third case (case 3) where the blocking member was formed as illustrated in FIG. 10.

It was found that no problem occurred in the touch unit due to static electricity when a voltage of 10 kV was applied from the outside, but a problem occurred 3 times among 5 times in the touch unit due to static electricity when a voltage of 8 kV was applied from the outside in the fourth case (case 4) where the blocking member was formed as illustrated in FIG. 11.

As such, according to an exemplary embodiment of the present invention, it is possible to prevent a sealing member disposed in a non-display area of a display device from widening to prevent widening of the non-display area and to prevent static electricity from entering the display device from the outside to prevent damage to the display area by static electricity, by forming a blocking member having a rectangular shape around a region where the sealing member is disposed, Further, the blocking member has a longer edge in a direction parallel to an edge of the display device, and includes a plurality of blocking patterns in which edges are not disposed side by side along a direction from the edge of the display device toward the touch unit. For example, the edges of the plurality of blocking patterns may be misaligned with one another in the direction from the edge of the display device toward the touch unit.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a first substrate including a display area and a non-display area adjacent to the display area;
a display element disposed in the display area;
a sealing member disposed in the non-display area and spaced apart from the display element; and
a first blocking member disposed between the display element and the sealing member,
wherein the first blocking member includes:
a first blocking pattern extending in a first direction parallel to an edge of the first substrate, and
a second blocking pattern spaced apart in a second direction crossing the first direction and extending in the first direction,
wherein a width of the first blocking pattern in the second direction is different from a width of the second blocking pattern in the second direction.

2. The display device of claim 1, further comprising:
a second substrate overlapping the first substrate; and
a touch unit disposed on the second substrate and overlapping the display area.

3. The display device of claim 1, wherein
the first blocking pattern has a first width in the first direction and a second width in the second direction, and
the first width is different from the second width.

4. The display device of claim 3, wherein
the first width of the first blocking pattern is greater than the second width of the first blocking pattern.

5. The display device of claim 3, wherein.
the first blocking pattern is provided in plural, and
at least two of the first blocking patterns are disposed in a same row along the first direction.

6. The display device of claim 3, wherein
the second blocking pattern has a first width in the first direction and a second width in the second direction, and
the first width of the second blocking pattern is different from the second width of the second blocking pattern.

7. The display device of claim 6, wherein
the first width of the second blocking pattern is greater than the second width of the second blocking pattern.

8. The display device of claim 6, wherein
the second blocking pattern is provided in plural, and
at least two of the second blocking patterns are disposed in a same row along the first direction.

9. The display device of claim 8, wherein
at least two of the first blocking patterns are misaligned with at least two of the second blocking pattern in the second direction.

10. The display device of claim 2, further comprising
a second blocking member disposed between the sealing member and the edge of the first substrate.

11. The display device of claim 10, wherein
the first and second blocking members are free from overlapping the sealing member.

12. The display device of claim 10, wherein
at least one of the first and second blocking members is disposed on a same layer as the touch unit.

13. A display device comprising:
a first substrate including a display area and a non-display area;
a second substrate overlapping the first substrate;
a sealing member disposed in the non-display area and between the first substrate and the second substrate;
a touch unit disposed in the display area and on the second substrate; and
at least one blocking member disposed in the non-display area and on the second substrate,
wherein the at least one blocking member includes a plurality of blocking patterns,
each of the blocking patterns has a first edge and a second edge, wherein the first edge extends in a first direction parallel to an edge of the first substrate, and the second edge extends in a second direction different from the first direction, wherein a length of the first edge is different from a length of the second edge, and
the length of the second edge of one blocking pattern of the plurality of blocking patterns is different from the length of the second edge of another blocking pattern of the plurality of blocking patterns along the second direction.

14. The display device of claim 13, wherein
the at least one blocking member includes: a first blocking member disposed between the edge of the first substrate and the sealing member in a plan view; and
a second blocking member disposed between the sealing member and the touch unit in the plan view.

15. The display device of claim 14, wherein
the first and second blocking members do not overlap the sealing member.

16. The display device of claim 14, wherein
the first blocking member includes a plurality of first blocking patterns, a plurality of second blocking patterns, and a plurality of third blocking patterns sequentially disposed from the sealing member toward the edge of the first substrate,
wherein the first blocking patterns are disposed side by side along the first direction,
wherein the second blocking patterns are disposed side by side along the first direction, and
wherein the third blocking patterns are disposed side by side along the first direction.

17. The display device of claim 16, wherein
the second blocking member includes a plurality of fourth blocking patterns, a plurality of fifth blocking patterns, and a plurality of sixth blocking patterns sequentially disposed from the sealing member toward the touch unit,
wherein the fourth blocking patterns are disposed side by side along the first direction,
wherein the fifth blocking patterns are disposed side by side along the first direction, and
wherein the sixth blocking patterns are disposed side by side along the first direction.

18. The display device of claim 17, wherein
a first line extending through a central portion of one of the first blocking patterns along the second direction is disposed between the second edges of two adjacent second blocking patterns.

19. The display device of claim 18, wherein
a second line extending through a central portion of one of the fourth blocking patterns along the second direction is disposed between the second edges of two adjacent fifth blocking patterns.

20. The display device of claim 14, wherein the at least one blocking member is disposed on a same layer as the touch unit.

* * * * *